(12) United States Patent
Lim

(10) Patent No.: US 7,276,118 B2
(45) Date of Patent: Oct. 2, 2007

(54) SPIN-COATING APPARATUS FOR USE IN MANUFACTURING SEMICONDUCTOR DEVICES

(75) Inventor: Seung-Jun Lim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 78 days.

(21) Appl. No.: 11/123,019

(22) Filed: May 6, 2005

(65) Prior Publication Data

US 2005/0274315 A1    Dec. 15, 2005

(30) Foreign Application Priority Data

Jun. 10, 2004    (KR) .................... 10-2004-0042516

(51) Int. Cl.
*B05C 11/02* (2006.01)

(52) U.S. Cl. .................... 118/52; 118/612; 118/320

(58) Field of Classification Search .................. 118/52, 118/612, 319, 320, 326; 134/153, 198, 182, 134/183, 148, 104.2
See application file for complete search history.

(56) References Cited

U.S. PATENT DOCUMENTS

| 5,725,663 | A  | 3/1998 | Parrette |
| 6,179,915 | B1 | 1/2001 | Chen |
| 6,533,864 | B1 | 3/2003 | Matsuyama et al. |
| 6,599,571 | B2 | 7/2003 | Davis |

*Primary Examiner*—Yewebdar Tadesse
(74) *Attorney, Agent, or Firm*—Volentine & Whitt, PLLC

(57) ABSTRACT

Spin-coating apparatus for use in manufacturing a semiconductor device includes a spin-chuck for rotating a wafer or the like, and a baffle plate disposed under the spin chuck to collect and discharge residue spun off of the wafer as the wafer is rotated by the spin chuck. The inner periphery of the baffle plate and a portion of a clamping plate adjacent the inner periphery of the baffle plate are configured to prevent the baffle plate from moving up relative to the clamping plate. Also, an outer peripheral surface of the clamping plate and a portion of the baffle plate adjacent the outer peripheral edge of the clamping plate may be configured as a guide to seat the baffle plate on the clamping plate and prevent the baffle plate from moving laterally relative to the clamping plate.

5 Claims, 5 Drawing Sheets

SPIN-COATING APPARATUS FOR USE IN MANUFACTURING SEMICONDUCTOR DEVICES

BACKGROUND OF THE INVENTION

1. Field of the Invention

The present invention relates to spin-coating apparatus for coating a substrate in the manufacturing a semiconductor device or the like. More particularly, the present invention relates to a baffle plate positioned under the substrate during the spin-coating process, and to structure by which the baffle plate and a clamping plate are detachably connected.

2. Description of the Related Art

In the manufacturing of semiconductor devices, photoresist is typically applied to a wafer using a spin-coating apparatus. A conventional spin-coating apparatus is illustrated in FIG. 1. The spin-coating apparatus includes a spin chuck 1, a baffle plate 2, an upper cup 3, and a lower cup 4.

A wafer W is loaded onto the spin chuck 1 and is firmly secured to an upper platen of the chuck 1 by a vacuum. Photoresist is dispensed onto a center of the wafer W and the wafer W is rotated by the spin chuck. Thus, centrifugal force spreads the photoresist uniformly over the entire surface of the wafer W.

The baffle plate 2, the upper cup 3 and the lower cup 4 surround the spin chuck 1 and are movable up and down relative to the spin chuck 1. In particular, the baffle plate 2, the upper cup 3 and the lower cup 4 are moved downwardly so that the spin chuck 1 is positioned at the top of the upper cup 3. In this state, a wafer W is loaded onto the spin chuck 1. Then, the baffle plate 2, the upper cup 3 and the lower cup 4 are moved upwardly to the position shown in the figure, whereupon the wafer W secured to the spin chuck 1 is spin coated. The baffle plate 2, the upper cup 3 and the lower cup 4 are lowered immediately after the spin-coating process is performed. Then the wafer W is unloaded from the spin chuck 1.

During operation, therefore, the baffle plate 2 is positioned under the spin chuck 1 to collect and discharge residue that is discharged outwardly off of the wafer W while the wafer W is being spin-coated. Thus, the baffle plate 2 should be cleaned at regular intervals. To this end, the baffle plate 2 is adapted to be easily detached from a clamping plate 5.

U.S. Pat. No. 6,179,915, Japanese Unexamined Patent Publication No. 2002-164277, and Korean Unexamined Patent Publication No. 2002-032058 disclose structure by which the baffle plate 2 and the clamping plate 5 are detachably engaged. In this structure, the baffle plate 2 is seated on the clamping plate 5 in such a way that the baffle plate 2 is not rotated. However, the baffle plate 2 is minutely vibrated up and down by the clamping plate 5 during the spin-coating process. Thus, the baffle plate 2 often collides against a bottom surface of the wafer W located above the baffle plate 2. As a result, the wafer breaks or is otherwise damaged.

SUMMARY OF THE INVENTION

Therefore, an object of the present invention is to provide spin-coating apparatus in which a baffle plate is detachably connected to a clamping plate and yet the baffle plate is prevented from moving up relative to the a clamping plate while it is seated on the clamping plate.

According to one aspect of the present invention, the baffle plate and the clamping plate have locking means for detachably connecting the baffle plate to the clamping means and for preventing the baffle plate from moving vertically upwardly relative to the clamping plate while the baffle plate is seated thereon.

According to another aspect of the present invention, the locking means is in the form of at least one set of bosses and corresponding locking grooves. The bosses protrude radially from the peripheral surface of one of the baffle and clamping plates, whereas the corresponding locking grooves extend in a peripheral surface of the other of the baffle and clamping plates. Each of the bosses is adapted to be received in a respective one of the locking grooves.

Also, each of the locking grooves has an upper portion that is open at a top of the peripheral surface in which the locking groove extends, and a lower portion that is wider than the upper portion in a circumferential direction of the plates. Therefore, the bosses can be inserted into the locking grooves through the upper portions of the locking grooves, respectively, as the baffle plate is being seated on the clamping plate. Furthermore, the baffle plate can be rotated relative to the clamping plate to lock the bosses within the grooves and thereby prevent the baffle plate from moving upwardly relative to the clamping plate.

In accordance with another aspect of the invention, the baffle plate and the clamping plate are provided with two sets of the bosses and locking grooves. In particular, the baffle plate and the clamping plate each have first and second concentric annular peripheral surfaces, a plurality of first bosses and first locking grooves, and a plurality of second bosses and second locking grooves. The first bosses protrude radially from the first annular peripheral surface of one of the baffle and clamping plates, and the first locking grooves extend in and are open at the first annular peripheral surface of the other of the baffle and clamping plates. Each of the first bosses is received in a respective one of the first locking grooves. Likewise, the second bosses protrude radially from the second annular peripheral surface of one of the baffle and clamping plates, and the second locking grooves extend in and are open at the second annular peripheral surface of the other of the baffle and clamping plates. Each of the second bosses is received in a respective one of the second locking grooves.

Preferably, the first bosses protrude from one of the baffle and clamping plates, and the second bosses protrude from the other of the baffle and clamping plates. In this case, the first and second locking grooves extend in opposite circumferential directions of the plates. When the baffle plate is placed on the clamping plate and rotated, the first bosses and second bosses are simultaneously inserted into the first and second locking grooves, respectively, and then the first and second bosses are moved in opposite circumferential directions relative to the locking grooves in which they are received.

Another object of the present invention is to provide spin-coating apparatus having an improved means of seating a baffle plate on a clamping plate.

According to yet another aspect of the invention, the baffle plate and the clamping plate include guide means for guiding the baffle plate onto the clamping plate and for preventing the baffle plate from moving laterally relative to the clamping plate while the baffle plate is seated thereon.

The guide means may be in the form of respective frusto-conical surfaces of the plates that contact each other. Preferably the frusto-conical surface of the clamping plate is a radially outer peripheral surface thereof, and the frusto-conical surface of the baffle plate is a radially inner peripheral surface thereof. Regardless of the manufacturing tolerances, these frusto-conical surfaces will be in surface-to-contact and thereby seat the baffle plate on the clamping plate while preventing the baffle plate from moving laterally relative to the clamping plate.

BRIEF DESCRIPTION OF THE DRAWINGS

The above and other features and advantages of the present invention will become more apparent to those of ordinary skill in the art from the following detailed description of the preferred embodiments thereof made with reference to the attached drawings in which.

DETAILED DESCRIPTION OF THE PREFERRED EMBODIMENTS

The present invention will now be described more fully hereinafter with reference to the accompanying drawings. Like reference numbers designate like elements throughout the drawings.

Figure 1:
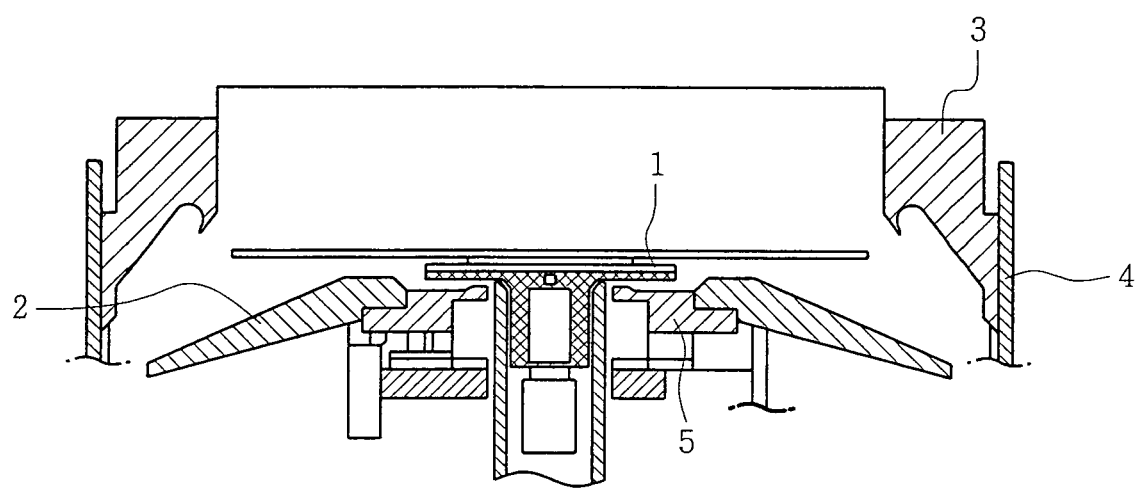
FIG. 1 is a cross-sectional view of conventional spin-coating apparatus for use in manufacturing a semiconductor device.

The spin-coating apparatus according to the present invention includes a spin chuck, a baffle plate, an upper cup, a lower cup, and a clamping plate, similar to those described with respect to the conventional spin-coating apparatus shown in FIG. 1. Thus, the spin chuck is interposed between the upper cup and the lower cup, and the baffle plate is disposed immediately below the spin chuck during the spin-coating operation.

Also, the baffle plate is annular so as to have a through-hole at the center thereof. The trough-hole has a diameter greater than that of the spin chuck. Moreover, a lower portion of the through hole has a diameter greater than the upper portion of the through-hole. The clamping plate is inserted into the through-hole of the baffle plate when the baffle plate is detachably connected to the clamping plate. In this state, the clamping plate extends into the lower portion of the through-hole and is engaged with the baffle plate such the baffle plate is firmly seated on the clamping plate.

The above-described features are substantially similar to those of conventional spin-coating apparatus. However, the present invention is characterized by also comprising locking means for preventing the baffle plate from moving vertically relative to the clamping plate. The present invention may also include guide means for both guiding the baffle plate onto the clamping plate and preventing the baffle plate from moving laterally relative to the clamping plate.

Figure 2:
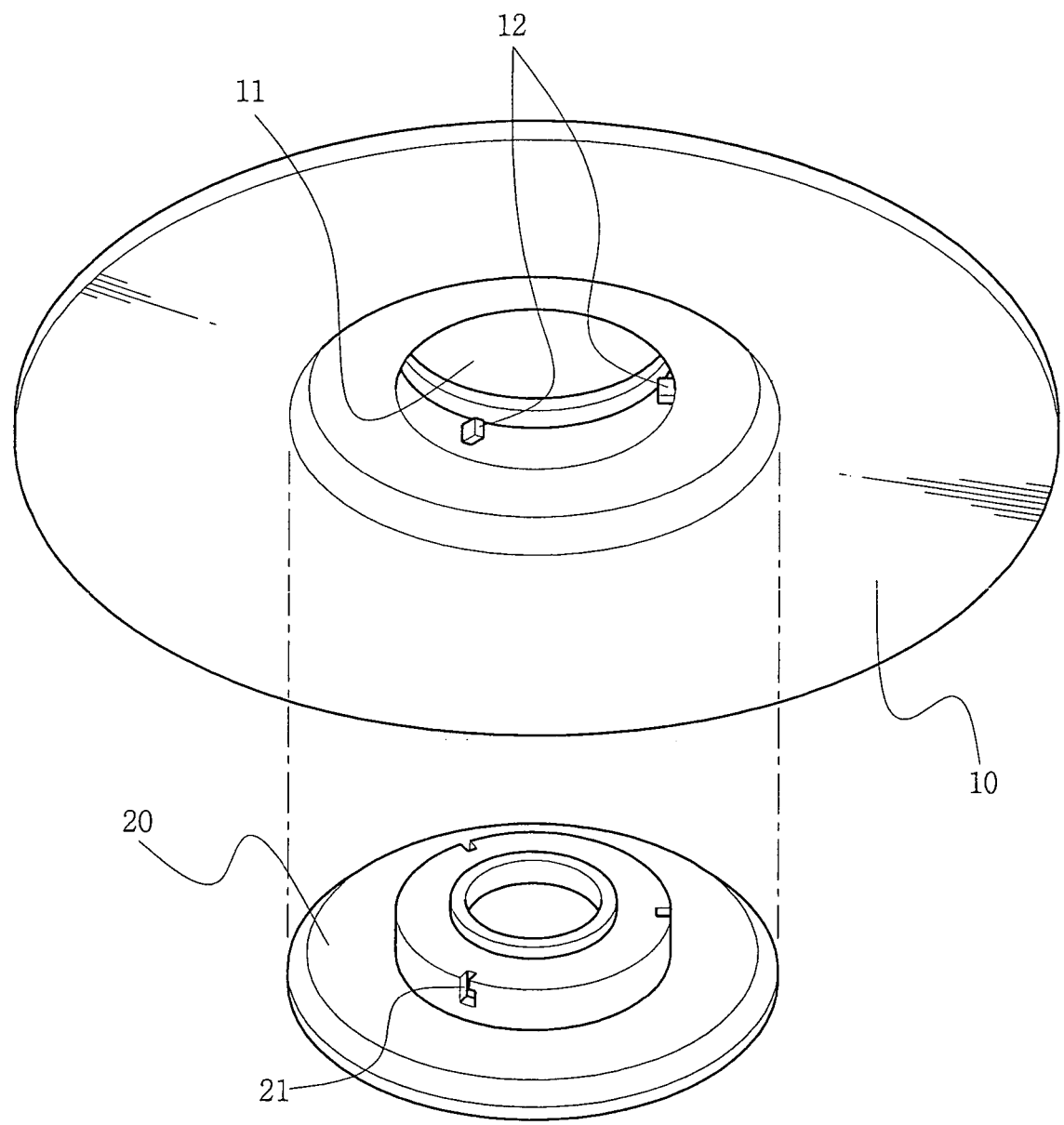
FIG. 2 is an exploded perspective view of a baffle plate and a clamping plate of a first embodiment of spin-coating apparatus according to the present invention.
Figure 3:
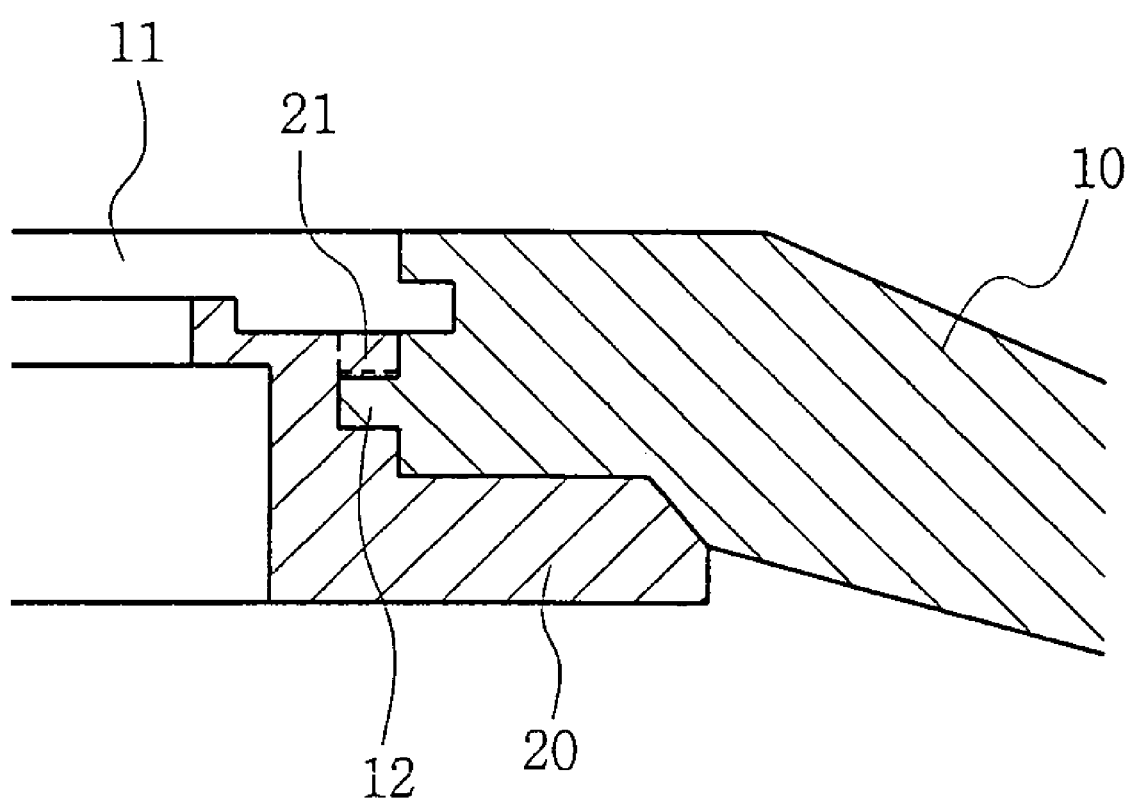
FIG. 3 is an enlarged cross-sectional view of the structure by which the baffle plate and the clamping plate shown in FIG. 2 are engaged.

Referring first to FIGS. 2 and 3, a baffle plate 10 of a first embodiment of spin-coating apparatus according to the present invention has a through-hole 11 at the center thereof, and a plurality of bosses 12 protruding from a radially inner peripheral surface towards the center of the baffle plate at the lower portion of the through-hole 11. Also, the baffle plate 10 is concentric with and seated on a clamping plate 20. The clamping plate 20 has locking grooves 21 for receiving the bosses 12 of the baffle plate 10. The locking grooves 21 extend in a radially outer peripheral surface of the clamping plate 20. The locking grooves 21 are adapted to allow the bosses 12 to move in a circumferential direction of the clamping plate 20 after the bosses 12 have been fully inserted into the grooves 21. The bosses 12 and the locking grooves 21 form locking means.

The depth of each locking groove 21 is greater than the height of the boss 12 of the baffle plate 10 inserted into the locking groove. Also, each locking groove 21 has an upper portion open at the top of the peripheral surface in which the groove extends, and a lower portion extending in the circumferential direction of the clamping plate 20 (and baffle plate 10). The width of the upper portion of the locking groove 21 is substantially similar to the thickness of the boss 12 inserted into the locking groove. On the other hand, the width of the bottom portion of each locking groove 21, as measured in the circumferential direction of the clamping plate 20, is slightly greater than the thickness of the boss 12 inserted into the locking groove.

The number and locations of the bosses 12 of the baffle plate 10 correspond to those of the locking grooves 21 in the clamping plate 20. Therefore, the baffle plate 10 can be attached to the clamping plate 20 by inserting the bosses 12 into the locking grooves 21, and rotating the baffle plate 10 in one direction to prevent the bosses 12 from escaping from the locking grooves 21. Accordingly, the baffle plate 10 is prevented from moving vertically relative to the clamping plate 20.

The baffle plate 10 and clamping plate 20 also have guide means for guiding the baffle plate 10 into seated engagement therewith and for preventing the baffle plate 10 from moving laterally relative to the clamping plate. More specifically, the clamping plate 20 includes an inclined outer peripheral surface, i.e., a frusto-conical outer peripheral surface. The baffle plate 10 has a corresponding inclined (frusto-conical) inner peripheral surface. The inclined outer and inner peripheral surfaces of the clamping plate 20 and the baffle plate 10 contact each other as and once the baffle plate 10 is seated on the clamping plate 20. Thus, the guide means prevents the baffle plate 10 from being moved laterally once the baffle plate 10 has been mounted to the clamping plate 20.

Figure 4:
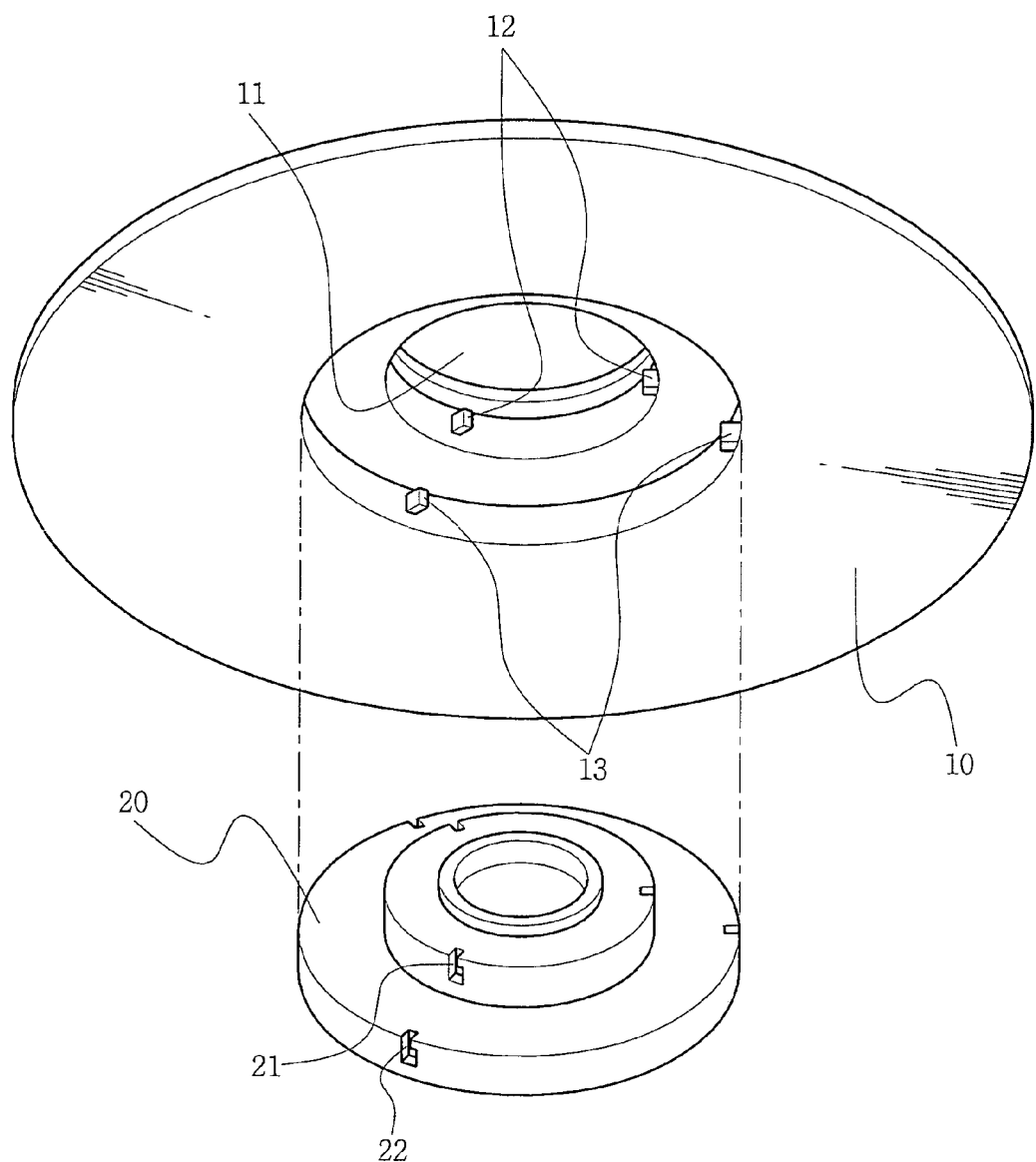
FIG. 4 is an exploded perspective view of a baffle plate and a clamping plate of a second embodiment of spin-coating apparatus according to the present invention.
Figure 5:
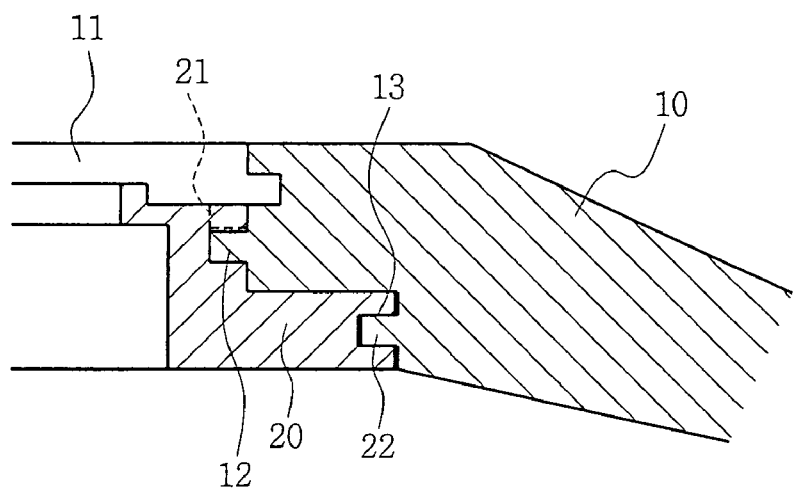
FIG. 5 is an enlarged cross-sectional view of structure by which the baffle plate and the clamping plate shown in FIG. 4 are engaged.

FIGS. 4 and 5 illustrate a second embodiment of a clamping plate 20 and a baffle plate 10 according to the present invention.

The baffle plate 10 is annular so as to have a through-hole 11 at the center thereof. The baffle plate 10 also has a plurality of first bosses 12 protruding towards the center of the baffle plate at an upper portion of the through-hole 11. The baffle plate 10 is concentric with and seated on a clamping plate 20. The clamping plate 20 has first locking grooves 21 for receiving the bosses 12 of the baffle plate 10. The locking grooves 21 are adapted to allow the bosses 12 to move in a circumferential direction of the clamping plate 20 after the bosses have been fully inserted into the grooves. The bosses 12 and the locking grooves 21 form locking means.

Thus, the baffle plate 10 can be attached to the clamping plate 20 by inserting the bosses 12 into the locking grooves 21, and rotating the baffle plate 10 in one direction to prevent the bosses 12 from escaping from the locking grooves 21. Accordingly, the baffle plate 10 is prevented from moving vertically relative to the clamping plate 20.

The clamping plate 20 also has second locking grooves 22 in the outermost peripheral surface thereof. Like the first locking grooves 21, each second locking groove 22 has an upper portion, and a lower portion extending in the circumferential direction of the clamping plate 20. The baffle plate 10 has a plurality of second bosses 13 protruding towards the center of the baffle plate 10 at a lower portion of the through-hole. The second bosses 13 can be inserted into the locking grooves 22. In particular, each second boss 13 has a thickness substantially equal to the width of the upper portion of a second locking groove 22, and less than the width of the lower portion of the second locking groove 22. The second bosses 13 of the baffle plate 10 and the second locking grooves 22 are relatively positioned such that the second bosses 13 are received in the second locking grooves 22 of the clamping plate 20 at the same time the first bosses 12 of the baffle plate are inserted into the first locking grooves 21 of the clamping plate 20.

Accordingly, the second bosses 13 and second locking grooves 22 provide a double locking effect when the baffle plate 10 is placed on the clamping plate 20 and rotated relative to the clamping plate. That is, the baffle plate 10 is strongly prevented from moving upwardly relative to the clamping plate 20.

Figure 6:
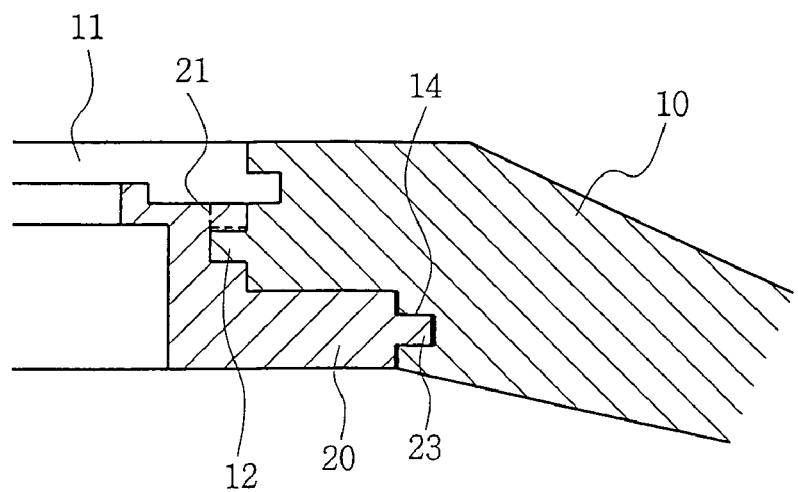
FIG. 6 is an enlarged cross-sectional of structure by which a baffle plate and a clamping plate are engaged in another embodiment of spin-coating apparatus according to the present invention.

FIG. 6 illustrates another embodiment of a baffle plate 20 and a clamping plate 10 of spin-coating apparatus according to the present invention. The baffle plate 10 is annular and thus, has a through-hole 11 at the center thereof. The baffle plate 10 also has a plurality of first bosses 12 protruding towards the center of the baffle plate formed at an upper portion of the through-hole 11. The baffle plate 10 is concentric with and seated on a clamping plate 20. The clamping plate 20 has first locking grooves 21 for receiving the bosses 12 of the baffle plate 10. The locking grooves 21 are adapted to allow the bosses 12 to move in a circumferential direction of the clamping plate 20 after the bosses have been fully inserted into the grooves. The bosses 12 and the locking grooves 21 are similar to those of the second embodiment.

However, unlike the second embodiment, the clamping plate has second bosses 23 protruding at the outer periphery of the clamping plate 20, and the baffle plate 10 has second locking grooves 14 facing the second bosses 23. When the baffle plate 10 is mounted to the clamping plate 20, the bosses 23 of the clamping plate 20 are received in the locking grooves 14 of the baffle plate 10 as the first bosses 12 of the baffle plate 10 are inserted into the first locking grooves 21 of the clamping plate 20. Then, as the baffle plate is rotated in one direction, the first bosses 12 and the second bosses 23 are moved relative to each other in opposite directions, thereby firmly locking the baffle plate 10 to the clamping plate 20.

Although each of the embodiments has been illustrated as having at least one set of three bosses and locking grooves, the present invention is not so limited. Rather, the number of bosses and corresponding locking grooves may vary. Also, as concerns the second and third embodiments, the respective first and second sets of bosses and locking grooves may be provided at the same radial position or may be located at different radial positions (i.e., offset from each other in the circumferential direction of the plates).

According to the present invention as described above, the locking means provided at the inner and outer peripheral portions of the baffle plate and clamping plate prevent the baffle plate from moving upwardly relative to the clamping pate during the spin-coating process. Thus, the locking means prevents the baffle plate from colliding against a wafer during the spin-coating process. As a result, the present invention can prevent the substrates, such as wafers, from being broken by the baffle plate during the spin-coating process, thereby maximizing the yield of products. Also, the clamping plate may be provided with guide means for guiding the baffle plate onto the clamping plate, while ensuring surface to surface contact along some vertical component once the baffle plate is mounted to the clamping plate. Thus, the guide means prevents the baffle plate from moving laterally relative to the clamping plate.

Finally, although the present invention has been described above in connection with the preferred embodiments thereof, the invention may, however, be embodied differently. Therefore, changes to and modifications of the disclosed embodiments are seen to be within the true spirit and scope of the present invention as defined by the appended claims.

What is claimed is:

1. Spin-coating apparatus comprising:
a spin-chuck;
a baffle plate disposed under the spin chuck and extending radially outwardly thereof to collect and discharge a residue dispersed outwardly when a substrate held by the spin chuck is spin-coated, said baffle plate having a peripheral surface; and
a clamping plate having a peripheral surface, the baffle plate being seated on the clamping plate with the peripheral surfaces of the plates facing each other, and
wherein one of said baffle and clamping plates has a plurality of first bosses protruding radially from the peripheral surface thereof, and the other of said baffle and clamping plates has a plurality of first locking grooves extending therein and open at the peripheral surface thereof, each of the first bosses being received in a respective one of the first locking grooves, and
each of the first locking grooves having an upper portion that is open at a top of the peripheral surface in which the locking groove extends, and a lower portion that is wider than the upper portion in a circumferential direction of the baffle and clamping plates, whereby the bosses can be inserted into the locking grooves through the upper portions of the locking grooves, respectively, as the baffle plate is being seated on the clamping plate, and whereby the baffle plate can be rotated relative to the clamping plate when seated thereon to lock the bosses within the grooves and thereby prevent the baffle plate from moving upwardly relative to the clamping plate.

2. The spin-coating apparatus of claim 1, wherein said baffle plate and said clamping plate have respective frusto-conical surfaces that contact each other, and thereby seat the baffle plate on the clamping plate and prevent the baffle plate from moving laterally relative to the clamping plate.

3. The spinner according to claim 1, wherein the frusto-conical surface of the clamping plate is a radially outer peripheral surface thereof, and the frusto-conical surface of the baffle plate is a radially inner peripheral surface thereof.

4. Spin-coating apparatus comprising:
a spin-chuck;
a baffle plate disposed under the spin chuck and extending radially outwardly thereof to collect and discharge a residue dispersed outwardly when a substrate held by the spin chuck is spin-coated, said baffle plate having first and second concentric annular peripheral surfaces; and a clamping plate having first and second concentric annular peripheral surfaces, the baffle plate being seated on the clamping plate with the annular peripheral surfaces of the plates facing each other, respectively, and wherein one of said baffle and clamping plates has a plurality of first bosses protruding radially from the first annular peripheral surface thereof, and the other of said baffle and clamping plates has a plurality of first locking grooves extending therein and open at the first annular peripheral surface thereof, each of the first bosses being received in a respective one of the first locking grooves, each of the first locking grooves having an upper portion that is open at a top of the first annular peripheral surface in which the locking groove extends, and a lower portion that is wider than the upper portion in a circumferential direction of the baffle and clamping plates, whereby the bosses can be inserted into the first locking grooves through the upper portions of the first locking grooves, respectively, as the baffle plate is being seated on the clamping plate, and whereby the baffle plate can be rotated relative to the clamping plate when seated thereon to lock the first bosses within the first locking grooves and thereby prevent the baffle plate from moving upwardly relative to the clamping plate, and wherein one of said baffle and clamping plates has a plurality of second bosses protruding radially from the second annular peripheral surface thereof, and the other of said baffle and clamping plates has a plurality of second locking grooves extending therein and open at the second annular peripheral surface thereof, each of the second bosses being received in a respective one of the second locking grooves, and each of the second locking grooves having an upper portion that is open at a top of the second annular peripheral surface in which the locking groove extends, and a lower portion that is wider than the upper portion in a circumferential direction of the baffle and clamping plates.

5. The spin-coating apparatus according to claim 4, wherein the first bosses protrude from one of the baffle and clamping plates, the second bosses protrude from the other of the baffle and clamping plates, the lower portions of the first locking grooves extend from the upper portions of the first locking grooves, respectively, in a first circumferential direction of the baffle and clamping plates, and the lower portions of the second locking grooves extend from the upper portions of the second locking grooves, respectively, in a second circumferential direction of the baffle and clamping plates opposite the first circumferential direction.

* * * * *